(12) United States Patent
Costello

(10) Patent No.: US 7,618,283 B1
(45) Date of Patent: Nov. 17, 2009

(54) BRIDGE CONNECTOR FOR CONNECTING CIRCUIT BOARDS

(75) Inventor: Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/108,010

(22) Filed: Apr. 23, 2008

(51) Int. Cl.
*H01R 31/08* (2006.01)

(52) U.S. Cl. ........................ 439/511; 439/65

(58) Field of Classification Search .............. 439/65, 439/511, 510, 507, 329, 67; 361/776
See application file for complete search history.

(56) References Cited

U.S. PATENT DOCUMENTS

| | | | | |
|---|---|---|---|---|
| 4,120,041 A | * | 10/1978 | Hayakawa et al. | 708/190 |
| 4,686,607 A | * | 8/1987 | Johnson | 361/788 |
| 4,938,701 A | | 7/1990 | Heberling | |
| 5,169,337 A | * | 12/1992 | Ortega et al. | 439/510 |
| 5,225,633 A | * | 7/1993 | Wigginton | 174/84 R |
| 5,257,941 A | * | 11/1993 | Lwee et al. | 439/65 |
| 5,429,521 A | * | 7/1995 | Morlion et al. | 439/108 |
| 5,628,557 A | * | 5/1997 | Huang | 362/249.14 |
| 5,742,484 A | | 4/1998 | Gillette et al. | |
| 5,887,158 A | * | 3/1999 | Sample et al. | 716/15 |
| 6,031,730 A | | 2/2000 | Kroske | |
| 6,188,583 B1 | * | 2/2001 | Fendt et al. | 361/796 |
| 6,299,469 B1 | * | 10/2001 | Glovatsky et al. | 439/329 |
| 6,302,705 B1 | * | 10/2001 | Yatskov et al. | 439/67 |
| 6,315,581 B1 | | 11/2001 | Yu | |
| 6,425,707 B1 | * | 7/2002 | Baxter | 405/87 |
| 6,425,767 B1 | * | 7/2002 | Lin | 439/65 |
| 6,454,582 B2 | * | 9/2002 | Yamanashi et al. | 439/189 |
| 6,464,510 B1 | * | 10/2002 | Len | 439/65 |
| 6,594,152 B2 | * | 7/2003 | Dent | 361/785 |
| 6,603,079 B2 | * | 8/2003 | Biron | 174/254 |
| 6,612,851 B1 | | 9/2003 | Goodwin | |
| 6,623,280 B2 | * | 9/2003 | Oldenburg et al. | 439/75 |
| 6,666,713 B1 | * | 12/2003 | Norvelle | 439/507 |
| 6,781,822 B1 | | 8/2004 | Mercer et al. | |
| 6,945,810 B1 | * | 9/2005 | Morana et al. | 439/378 |
| 7,203,074 B1 | | 4/2007 | Yaung et al. | |
| 7,286,370 B2 | * | 10/2007 | Ooyabu | 361/803 |
| 7,341,476 B2 | * | 3/2008 | Soeta | 439/493 |
| 2004/0018757 A1 | | 1/2004 | Lang et al. | |
| 2006/0264076 A1 | * | 11/2006 | Chen | 439/82 |
| 2007/0275587 A1 | | 11/2007 | Chang et al. | |
| 2007/0298641 A1 | * | 12/2007 | Yamamoto et al. | 439/260 |

* cited by examiner

*Primary Examiner*—Neil Abrams
*Assistant Examiner*—Harshad C Patel

(57) ABSTRACT

A bridge connector that is configured to electrically and mechanically couple first and second circuit boards is provided. Each circuit board includes a board surface having through-holes. The connector includes a housing having a coupling side configured to interface with the board surfaces when the housing is coupled to the first and second circuit boards. The connector also includes a plurality of bridge contacts that are held within the housing. Each contact includes tail portions that project from the coupling side. Each tail portion is configured to form an interference fit with a corresponding through-hole in order to couple the first and second circuit boards. The tail portions are arranged to hold the first and second circuit boards along the coupling side.

18 Claims, 7 Drawing Sheets

US 7,618,283 B1

BRIDGE CONNECTOR FOR CONNECTING CIRCUIT BOARDS

BACKGROUND OF THE INVENTION

The subject matter herein relates generally to electrical connectors and more particularly to bridge connectors that mechanically and electrically couple two or more circuit boards together.

Some electrical devices or systems use circuit board assemblies in which two or more circuit boards are fastened together. The circuit boards may be electrically coupled together in order to allows the circuit boards to transmit information between each other. For example, some known touchscreen systems utilize a display panel having multiple layers stacked upon each other. One of the layers may be a circuit board assembly having several circuit boards fastened together in a frame that forms the perimeter of a touchscreen area. The circuit boards are typically co-planar and include LEDs and phototransistor receivers. The LEDs and receivers form an optical grid along the touchscreen area that is used to determine the location of a touch. When a user touches the touchscreen area, the optical grid registers the touch information and relays the information through the circuit board assembly to a controller of the touchscreen system.

In one known method for coupling circuit boards together, a first circuit board is positioned adjacent to a second circuit board such that edges of the circuit boards are proximate to each other. Each circuit board includes a plurality of contact areas, such as bonding pads, that are formed along a corresponding edge. The contact areas of the first circuit board are aligned with the corresponding contact areas of the second circuit board. A conductive band formed from a conductive material is used to electrically couple the associated contact areas. However, although the circuit boards are electrically coupled to each other through the conductive bands, the conductive bands may not provide sufficient support to facilitate maintaining the positions of the circuit boards.

Other methods include soldering contacts to the surfaces of adjacent circuit boards and/or using resins or adhesives to couple the circuit boards together. However, these methods may have a limited ability to mechanically couple the circuit boards together such that the circuit boards maintain their spatial relationship. Furthermore, other methods generally involve using multiple steps in order to connect the circuit boards together.

Thus, there is a need for connectors that both electrically and mechanically couple two or more circuit boards together. There is also a need for a connector that may be applied to the circuit boards in order to couple the circuit boards together using fewer steps than at least some known connectors.

BRIEF DESCRIPTION OF THE INVENTION

In one embodiment, a bridge connector that is configured to electrically and mechanically couple first and second circuit boards is provided. Each circuit board includes a board surface having through-holes. The connector includes a housing having a coupling side configured to interface with the board surfaces when the housing is coupled to the first and second circuit boards. The connector also includes a plurality of bridge contacts that are held within the housing. Each contact includes tail portions that project from the coupling side. Each tail portion is configured to form an interference fit with a corresponding through-hole in order to couple the first and second circuit boards. The tail portions are arranged to hold the first and second circuit boards along the coupling side.

Optionally, the tail portions are configured to hold the circuit boards co-planar with respect to each other. Also, the tail portions may be configured to hold the circuit boards such that edges of the circuit boards directly abut each other and form an edge interface. Furthermore, the connector may also include a plurality of bridge contacts that are configured to mechanically and electrically couple the first circuit board to a third circuit board. Optionally the connector is only formed from the housing and the contacts.

In another embodiment, a bridge connector configured to electrically and mechanically couple first and second circuit boards is provided. Each circuit board includes a board surface having through-holes. The connector includes a housing that has a coupling side configured to interface with the board surfaces when the housing is coupled to the first and second circuit boards. The connector also includes at least one contact row that includes upper and lower bridge contacts held within the housing. Each of the upper and lower bridge contacts has tail portions that project from the coupling side, and each tail portion is configured to form an interference fit with a corresponding through-hole to couple the first and second circuit boards. The tail portions are arranged to hold the first and second circuit boards along the coupling side.

Optionally, the tail portions may extend along a common plane. Furthermore, the at least one contact row may include a plurality of contact rows that extend along a length of the housing. The contact rows may be spaced apart from each other along the width of the body. Also, the housing may include a plurality of slots that are configured to receive the contacts. The contacts may be held within slots that extend along a common plane that is substantially perpendicular to the board surfaces.

In yet another embodiment, a circuit board assembly is provided. The circuit board assembly includes a plurality of circuit boards where each circuit board includes a board surface having through-holes. The circuit board assembly also includes at least one bridge connector that is configured to electrically and mechanically couple adjacent circuit boards to each other. The connector includes a coupling side that is configured to interface with the board surfaces of adjacent circuit boards when the coupling side is mounted onto the adjacent circuit boards. The connector also includes a plurality of bridge contacts that are held within the connector. Each contact has tail portions that project from the coupling side, and each tail portion is configured to form an interference fit with a corresponding through-hole to couple the adjacent circuit boards. The tail portions are arranged to hold the adjacent circuit boards along the coupling side.

DETAILED DESCRIPTION OF THE INVENTION

Figure 1:
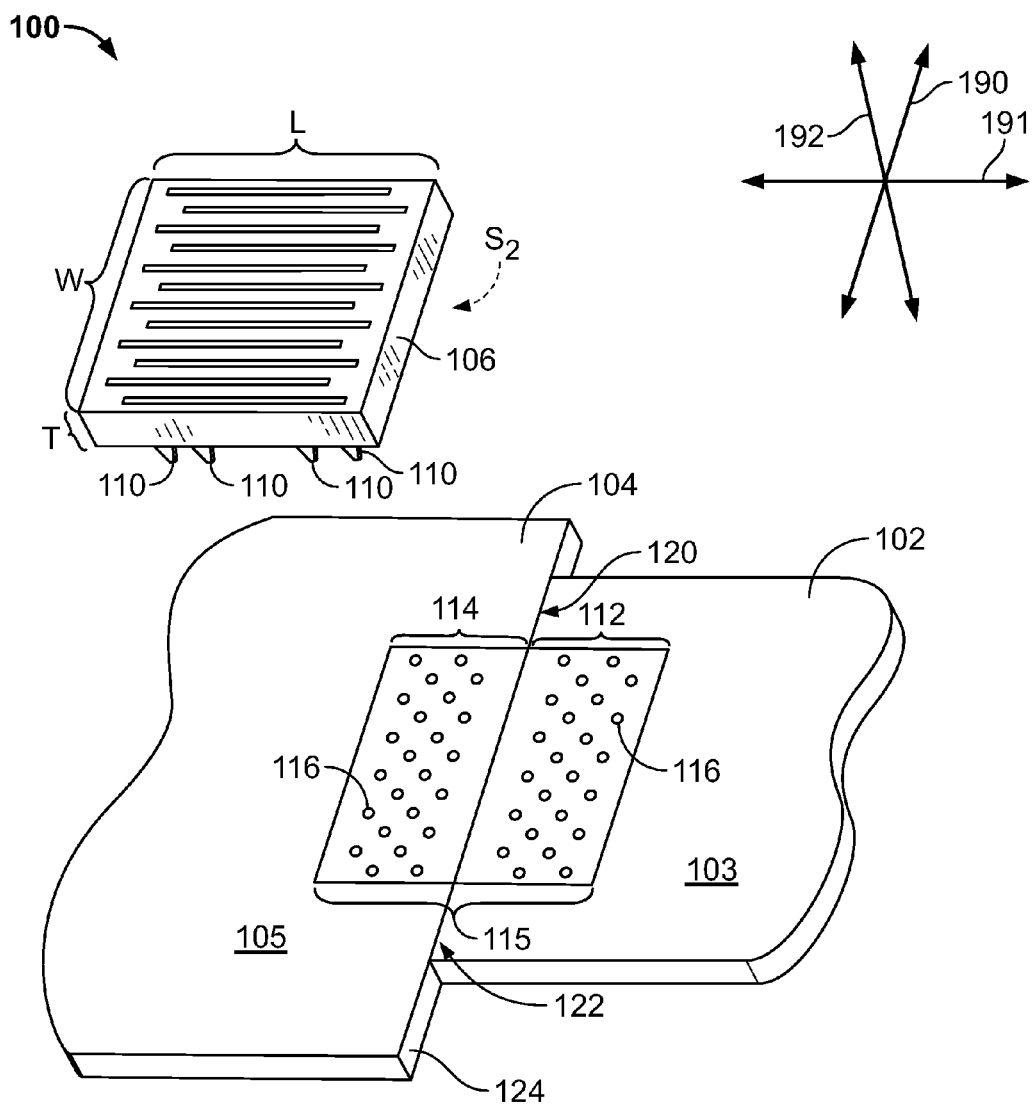
FIG. 1 is a perspective view of a bridge connector formed in accordance with one embodiment.

FIG. 1 is a perspective view of a bridge connector 100 formed in accordance with one embodiment and a pair of circuit boards 102 and 104. As will be discussed in greater detail below, the connector 100 is configured to mount and engage the circuit boards 102 and 104 in order to mechanically and electrically couple the circuit boards 102 and 104 together. In some embodiments, the connector 100 may be included as one part or component of an electrical device or the features of the connector 100 may be incorporated into a larger system or structure. However, in the illustrated embodiment, the exclusive function of the connector 100 is to mechanically and electrically couple the circuit boards 102 and 104 together. By way of example, the connector 100 may be used in constructing a circuit board assembly for use in an infrared (IR) touch system such as modular flat panels by Elo Touch Systems. Furthermore, FIG. 1 illustrates two circuit boards 102 and 104, however, alternative embodiments of the connector 100 may be configured to engage more than two circuit boards (for example, three or four circuit boards). Also, as described above, a plurality of connectors 100 may be used to interconnect several circuit boards into a circuit board assembly. For example, several circuit boards may be connected in a linear arrangement or several circuit boards may be connected to each other to form a frame that extends along a perimeter of a touchscreen.

As shown in FIG. 1, the connector 100 may include a housing 106 that holds a plurality of bridge contacts 140 and 150 (FIGS. 2-4) therein. The housing 106 may be formed from a dielectric material during, for example, an injection molding process. In one embodiment the housing 106 has a rigid body or structure. The housing 106 may also have a substantially rectangular body and include a length L, a width W, and a thickness T. Alternatively, the housing 106 may have other shapes configured to hold the plurality of contacts 140 and 150 and, optionally other components for an electrical device. The housing 106 may be shaped to have a plurality of sides including a coupling side $S_2$ that interfaces with the circuit boards 102 and 104 when the connector 100 is mounted thereon. The contacts 140 and 150 may extend lengthwise (i.e., parallel to a longitudinal axis 191) through the housing 106 and include tail portions 110 that project from the coupling side $S_2$ in a perpendicular manner (i.e., parallel to a vertical axis 192). The tail portions 110 may form any predetermined or desired arrangement on the coupling side $S_2$. As will be discussed in greater detail below, the tail portions 110 may form an arrangement that facilitates mechanically holding the circuit boards 102 and 104 in a desired spatial relationship.

The circuit boards 102 and 104 may have substantially rigid bodies and include board surfaces 103 and 105, respectively. The circuit boards 102 and 104 may be of a common type or structure, however, in alternative embodiments, the circuit boards 102 and 104 are not similar and may include, for example, different dimensions or are formed from a different substrate material. As shown in FIG. 1, the board surfaces 103 and 105 may form planes that are substantially co-planar and parallel with respect to a plane formed by the axes 191 and 190. The board surfaces 103 and 105 may include engagement areas 112 and 114, respectively, having associated through-holes 116 extending therethrough. When the circuit boards 102 and 104 are aligned, the engagement areas 112 and 114 indicate an interfacing area 115 of the circuit boards 102 and 104 where the housing 106 may engage and interface with. Optionally the engagement areas 112 and 114 may be marked or delineated on the board surfaces 103 and 105, respectively, to indicate to an operator where the housing 106 should be positioned. In the illustrated embodiment, the through-holes 116 form a pattern or an array that is similar to the arrangement of tail portions 110 projecting from the coupling side $S_2$. Furthermore, the through-holes 116 and corresponding tail portions 110 may be configured to form a press or interference fit.

In order to engage the circuit boards 102 and 104, the connector 100 may be aligned with the engagement areas 112 and 114 such that the tail portions 110 may be inserted into the corresponding through-holes 116. When the tail portions 110 are inserted into the corresponding through-holes 116, the combined interference fits may provide a tactile indication (i.e., snap-fit) to an operator that the connector 100 has been mounted to the circuit boards 102 and 104. As such, the connector 100 may provide a simple method for mechanically and electrically coupling the circuit boards 102 and 104 together.

Also shown in FIG. 1, the circuit boards 102 and 104 may include edges 122 and 124, respectively. Optionally when the circuit boards 102 and 104 are coupled to the connector 100, the edges 122 and 124 may directly abut each other along an edge interface 120. As shown in FIG. 1, the edge interface 120 may be substantially linear. However, alternative embodiments may include the edges 122 and 124 having complementary protrusions or teeth such that the circuit boards 102 and 104 may mate with each other before the connector 100 is mounted thereon.

Figure 2:
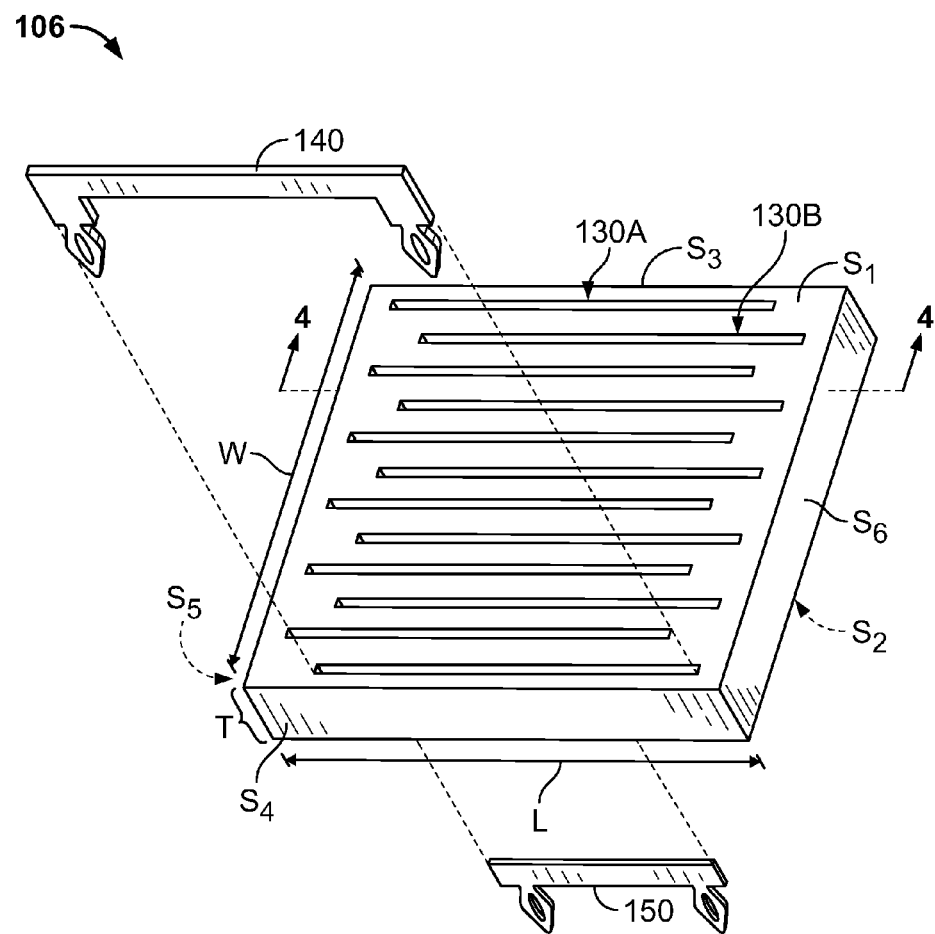
FIG. 2 is a top perspective view of the connector shown in FIG. 1.
Figure 3:
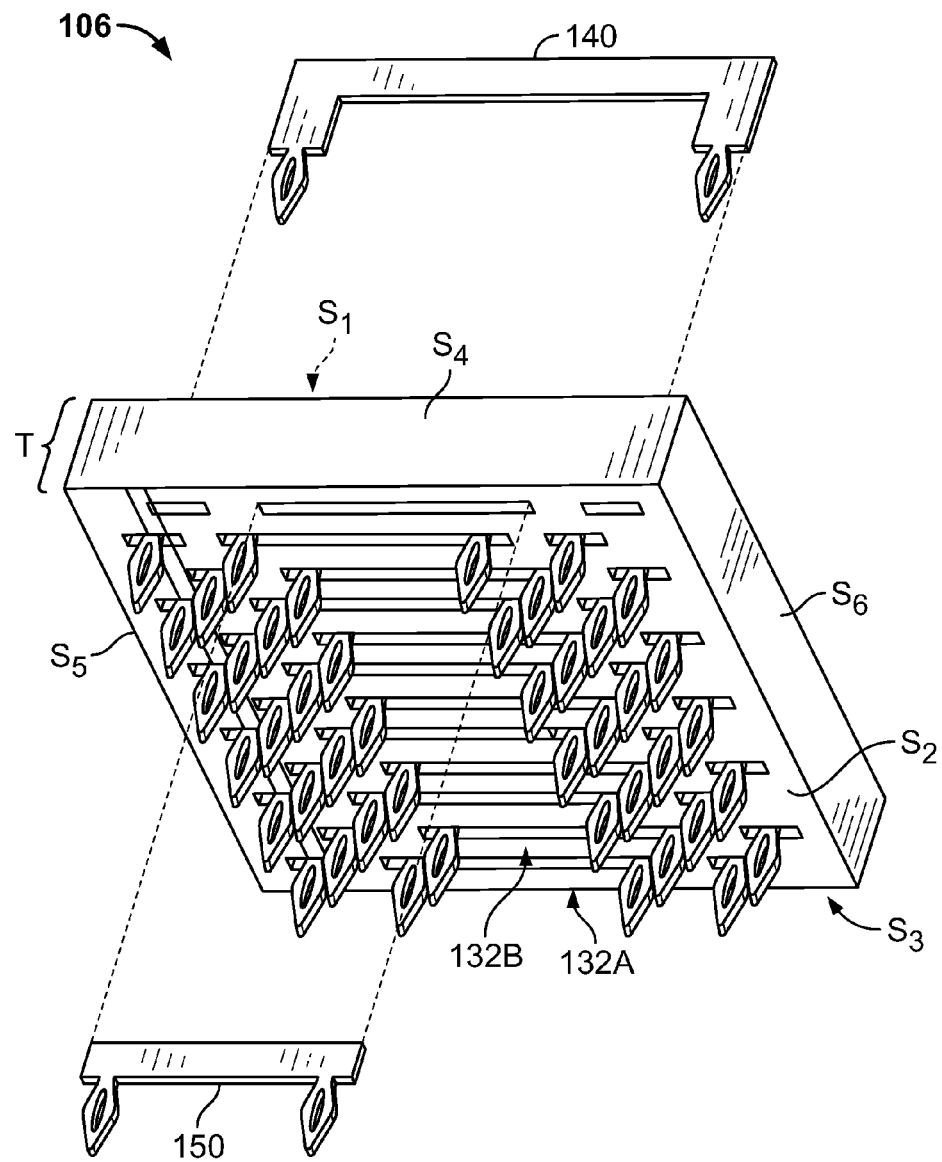
FIG. 3 is a bottom perspective view of the connector shown in FIG. 1.

FIGS. 2 and 3 provide top and bottom perspective views, respectively, of the housing 106. The housing 106 may include a plurality of sides $S_1$-$S_6$. As shown, the thickness T of the housing 106 extends between the coupling side $S_2$ and an opposing upper side $S_1$. As shown in FIG. 2, the length L extends between opposing sides $S_6$ and $S_5$ and is parallel to the longitudinal axis 191 (FIG. 1). The width W extends between opposing sides $S_3$ and $S_4$ and is parallel to a z-axis 190 (FIG. 1). Also shown, the housing 106 may include a plurality of upper slots 130 (FIG. 2) and lower slots 132 (FIG. 3) that extend lengthwise along the housing 106. The upper and lower slots 130 and 132 are configured to receive the contacts 140 and 150, respectively. The upper and lower slots 130 and 132 may be formed in the dielectric material of the housing 106 during a molding process. In alternative embodiments, the upper slots 130 and the lower slots 132 may extend widthwise or diagonally across the housing 106.

In one embodiment, the connector 100 may be a low-profile connector. As used herein, the term "low-profile" generally means that the thickness T of the connector 100 is configured to take up a minimal amount of space. As one example, the thickness T of the connector 100 is substantially equal to a sum of the widths of the contacts 140 and 150 plus the thickness of the housing material that separates the contacts 140 and 150. However, embodiments of the connector 100 are not required to be low-profile.

Figure 4:
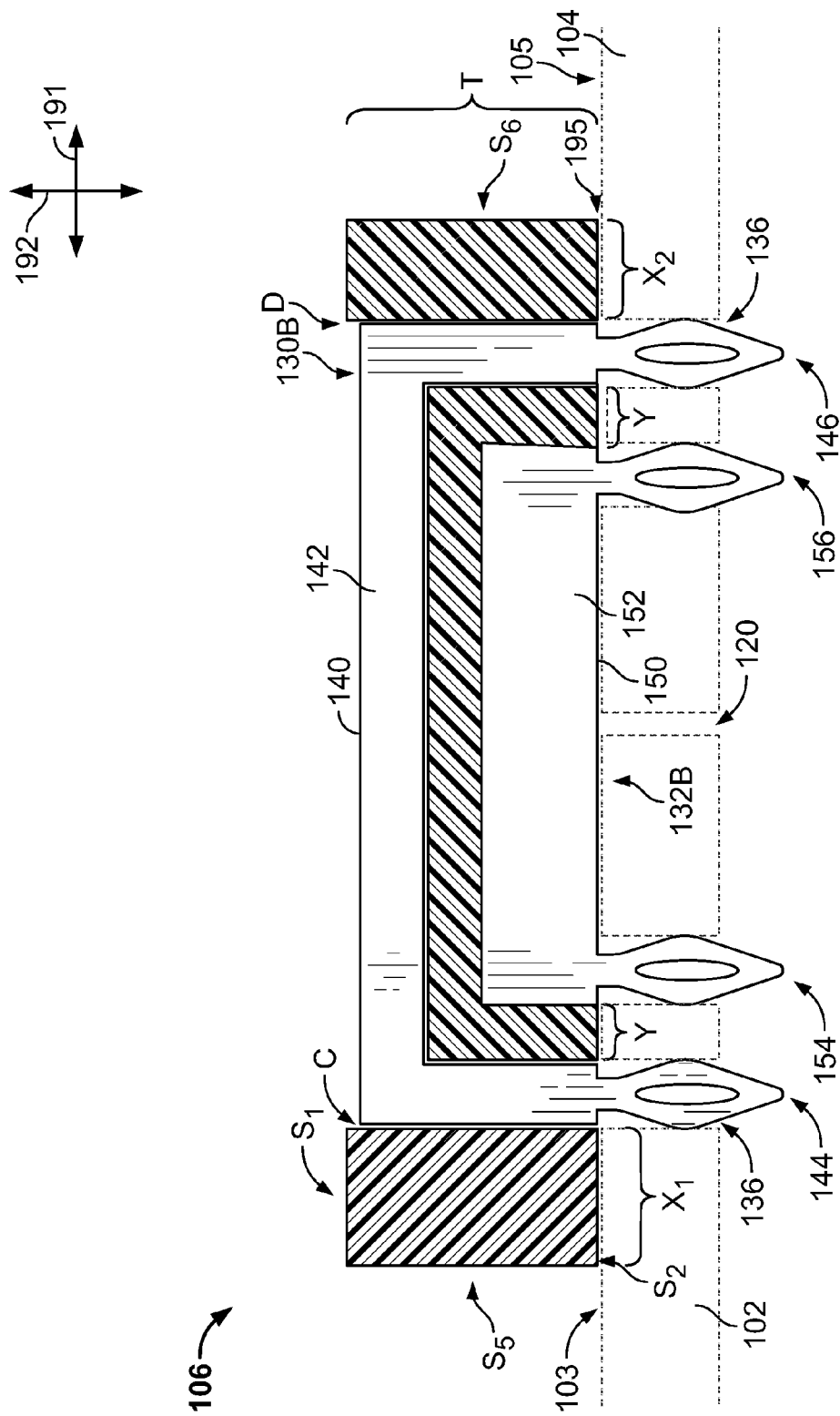
FIG. 4 is a cross-sectional view of the housing taken along the line 4-4 shown in FIG. 2.

FIG. 4 is a cross-sectional view of the connector 100 taken along the line 4-4 shown in FIG. 2 when engaged with the circuit boards 102 and 104. The coupling side $S_2$ and the board surfaces 103 and 105 share and extend along a side interface 195. As shown, the upper and lower slots 130B and 132B are configured to receive the contacts 140 and 150, respectively. The upper and lower slots 130B and 132B may form a contact row 200 (shown in FIG. 5). In the illustrated embodiment, the upper slots 130B and lower slots 132B of the contact row 200 extend along a common plane that is parallel to a vertical plane formed by the axes 192 and 191 and are perpendicular to the board surfaces 103 and 105. Although the following description is with reference to slots 130B and 132B in FIG. 4, the description may be similarly applied to slots 130A and 132A shown in FIGS. 2 and 3, respectively. As shown, the upper slot 130B opens onto the side $S_1$ and may have sections or leg portions that extend completely through the thickness T of the housing 106 such that tail portions 144 and 146 of the contact 140 may extend completely therethrough. As shown in FIG. 4, the upper slot 130B extends between a point C, which is a distance $X_1$ from the side $S_5$, and point D, which is a distance $X_2$ from the side $S_6$. Although in some embodiments $X_1$ and $X_2$ may be substantially equal, in the illustrated embodiment, $X_1$ is greater than $X_2$. As will be discussed in greater detail below, the contact rows 200 alternate between being the distance $X_1$ and a distance $X_3$ (FIG. 5) from the side $S_5$ and between being $X_2$ and $X_4$ (FIG. 5) from the side $S_6$.

The lower slot 132B extends a portion into the thickness T of the housing 106 and may open onto the coupling side $S_2$. The contacts 140 and 150 include tail portions 110 (FIG. 1). More specifically as shown in FIG. 4, the contact 140 includes the tail portions 144 and 146, and the contact 150 includes tail portions 154 and 156. In one embodiment, the tail portions 144, 154, 156, and 146 project from the coupling side $S_2$ along a common plane that is parallel to the vertical plane. Also shown, the tail portions 144 and 154 are separated by the housing material a distance Y and the tail portions 146 and 156 are also separated from each other the distance Y. However, in alternative embodiments, the distance separating the tail portions 144 and 154, and the distance separating the tail portions 146 and 156 may be different.

The contacts 140 and 150 may be held within the housing 106 in a stacked relationship. The contacts 140 and 150 may be inserted into the upper and lower slots 130B and 132B, respectively, and form an interference fit with the corresponding slots 130B and 132B. As shown, the contact 140 includes a body portion 142 that extends parallel to the board surfaces 103 and 105. The body portion 142 may be exposed to the surrounding environment along the side $S_1$. The contact 140 also includes the tail portions 144 and 146 that may extend from ends of the corresponding body portion 142 in a direction substantially perpendicular to the body portion 142. In the illustrated embodiment the contact 150 includes a body portion 152 that extends parallel to the board surfaces 103 and 105. The body portion 152 may be exposed to the surrounding environment along the coupling side $S_2$. The contact 150 also includes the tail portions 154 and 156 that extend from ends of the body portion 152.

As shown, the body portions 142 and 152 extend substantially parallel with respect to each other and the tail portions 144, 146, 154, and 156 extend substantially parallel to each other. Also, the contact 140 may surround the contact 150. The body portion 152 may be shorter than the body portion 142 and extend along a portion of a distance between the tail portions 144 and 146. As such, the tail portions 154 and 156 may be positioned between the tail portions 144 and 146.

However, in alternative embodiments, the body portions 142 and 152 may have non-linear paths that may or may not extend along with one another. For example, the body portion 152 may jog or deviate from a path made by the body portion 142 in order to make the electrical paths of the contacts 140 and 150 substantially equal. Furthermore, in alternative embodiments, the contacts 140 and 150 may not be exposed to surrounding environment but may be embedded within the housing 106.

Figure 5:
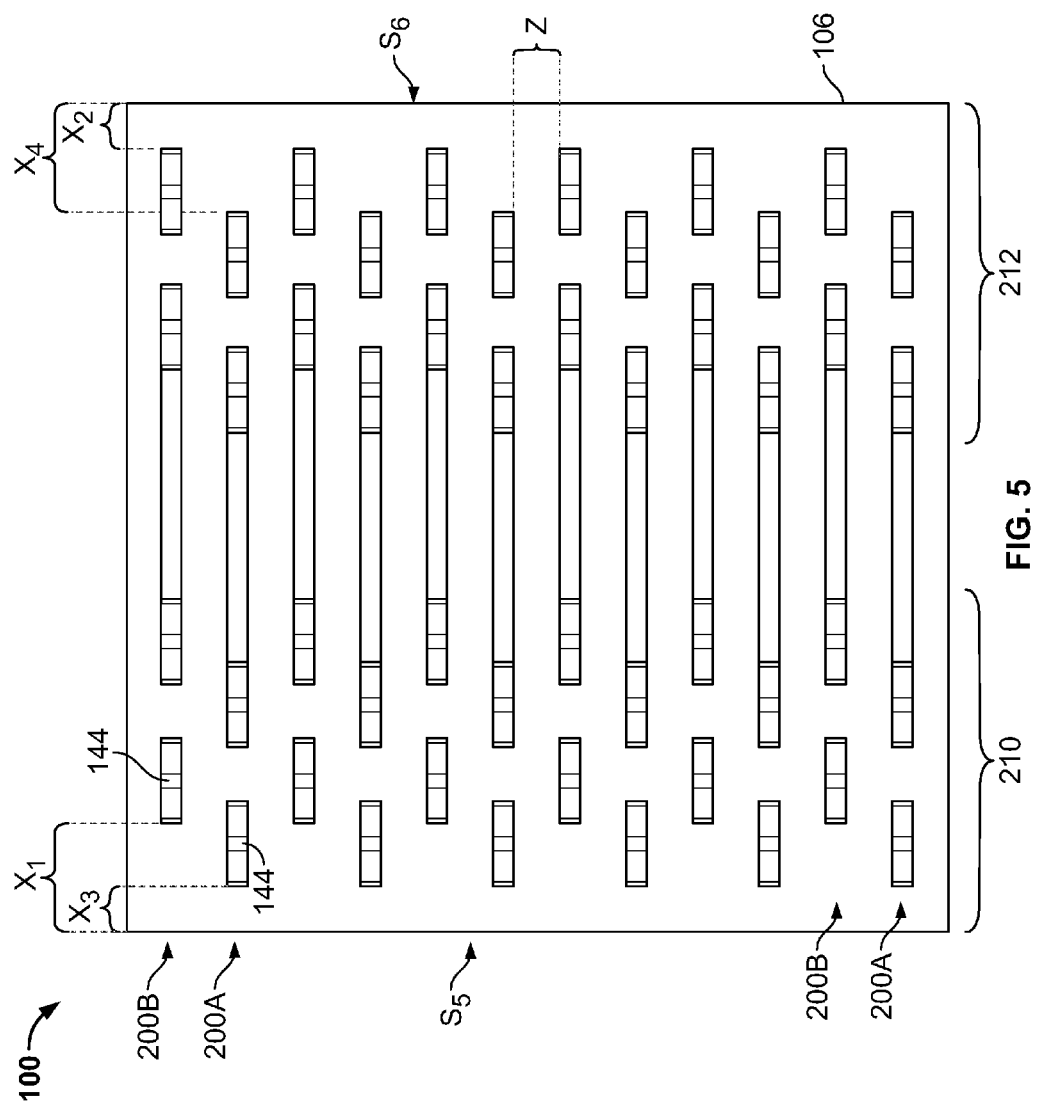
FIG. 5 is a bottom planar view of the connector shown in FIG. 1.

FIG. 5 is a bottom planar view of the connector 100. As described above, the contacts 140 and 150 (FIG. 4) of each associated pair of upper and lower slots 130 and 132 (FIG. 4) may form a contact row 200. As such, the connector 100 may include a plurality of contact rows 200 that are spaced apart from each other a distance Z along the width W (FIG. 1) of the housing 106. More specifically the contact rows 200A include the upper and lower slots 130A and 132A, and the contact rows 200B include the upper and lower slots 130B and 132B. Each contact row 200 includes a set of tail portions formed by the tail portions 144, 146, 154, and 156 (FIG. 4).

As described above, the contact rows 200A and 200B may alternate in position along the length L (FIG. 1) of the housing 106. More specifically the tail portion 144 of contact row 200A is the distance $X_1$ from the side $S_5$ and the tail portion 144 of the contact row 200B is the distance $X_3$ from the side $S_5$. As such, the tail portions 144, 146, 154, and 156 of the contacts 140 and 150 form contact grids 210 and 212 having multiple rows and columns of tail portions. In particular, the contact grid 210 includes the tail portions 144 and 154, and the contact grid 212 includes the tail portions 146 and 156. As such, the contact grids 210 and 212 provide multiple points throughout the interface 195 (FIG. 4) where an interference fit is formed between the connector 100 and the corresponding circuit board. As such, the connector 100 facilitates making a rigid connection that mechanically couples the circuit boards 102 and 104 to each other.

With reference again to FIG. 4, the tail portions 144, 146, 154, and 156 may include eye-of-needle shaped pins for forming an interference fit with the corresponding through-holes 136. However, the tail portions 144, 146, 154, and 156 may have a variety of shapes for being inserted into and engaging the corresponding through-holes. In one alternative embodiment, the tail portions 144, 146, 154, and 156 do not include eye-of-needle shaped pins, but have solder balls (not shown) for soldering the tail portions 144, 146, 154, and 156 to corresponding contact pads (not shown) on the circuit boards 102 and 104.

In the illustrated embodiment, the interface 195 does not include a resin or adhesive between the coupling side $S_2$ and the board surfaces 103 and 105. However, in alternative embodiments, a resin or adhesive may be applied along the interface 195 to facilitate bonding between the connector 100 and the circuit boards 102 and 104.

Figure 6:
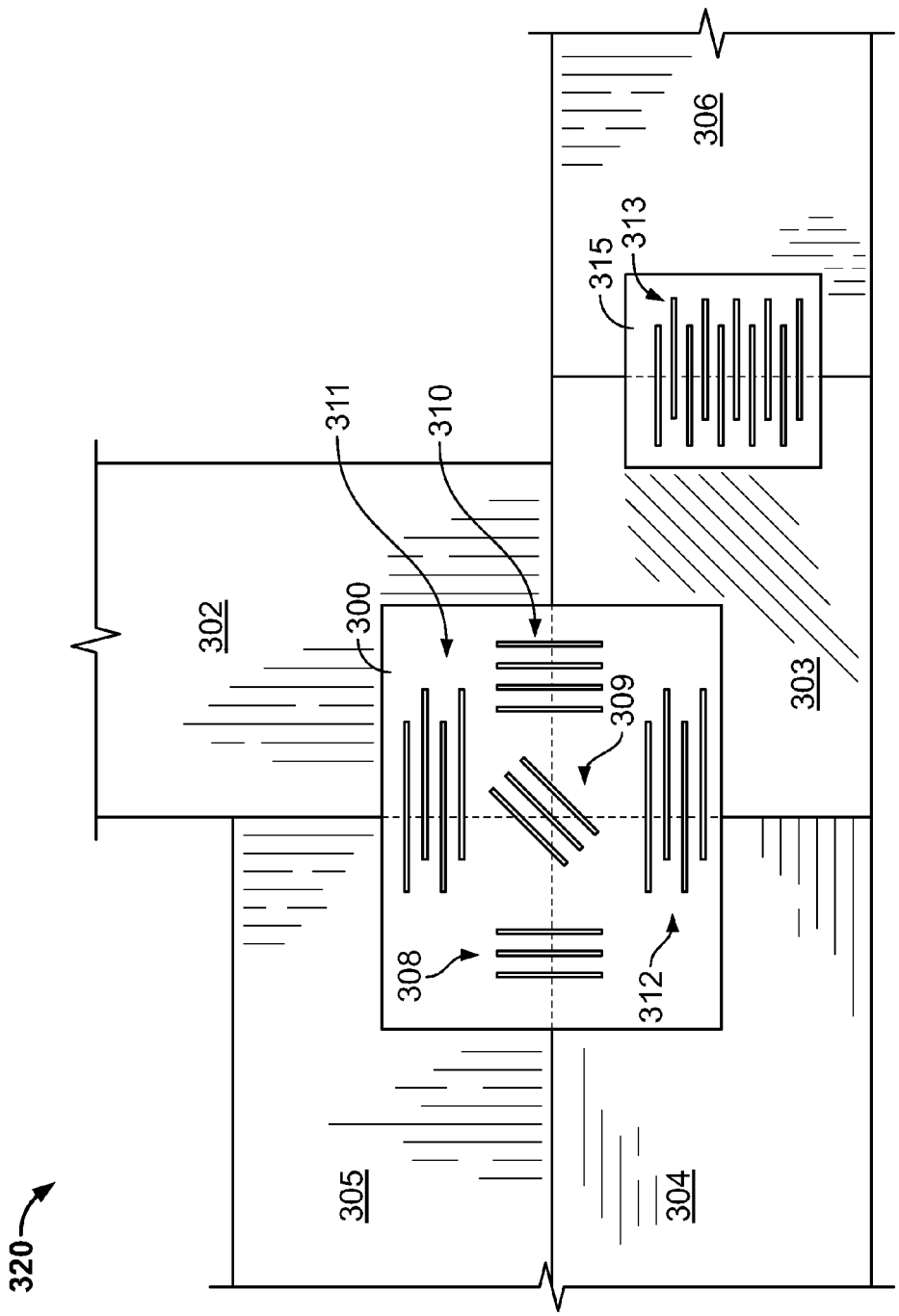
FIG. 6 is a top planar view of a circuit board assembly formed in accordance with one embodiment.

FIG. 6 is a top planar view of a circuit board assembly 320 formed in accordance with one embodiment. The circuit board assembly 320 includes a plurality of circuit boards 302-306 that may be positioned adjacent to one another and bridge connectors 300 and 315. The connectors 300 and 315 electrically and mechanically couple the circuit boards 302-306 to each other and may have similar features as described above with reference to the connector 100. As shown, the connector 300 may be configured to mechanically and electrically couple the adjacent circuit boards 302-305 in a square arrangement or structure. Each circuit board 302-305 may be mechanically and electrically coupled to two or more of the other circuit boards via sets of bridge contacts 308-312. The contacts of each set 308-312 may have similar features as described above with respect to the contacts 140 and 150 and may be arranged in contact rows, such as the contact rows 200 described above. Furthermore, each set of contacts 308-312 may have a staggered arrangement, such as in the sets of contacts 311 and 312, or the contacts may be aligned with each other, such as in the sets of contacts 308-310. Also shown, the connector 315 may couple the adjacent circuit boards 303 and 306 to each other. As such, the circuit board assembly 320 uses multiple connectors 300 and 315 and multiple sets of contacts 308-313 to form a unitary circuit board structure. In one embodiment, all of the circuit boards 302-306 are co-planar and in a fixed relationship with respect to each other. Although the circuit board assembly 320 is shown as having several circuit boards 302-306, alternative embodiments of the circuit board assembly 320 may have only two circuit boards held together by a bridge connector.

Figure 7:
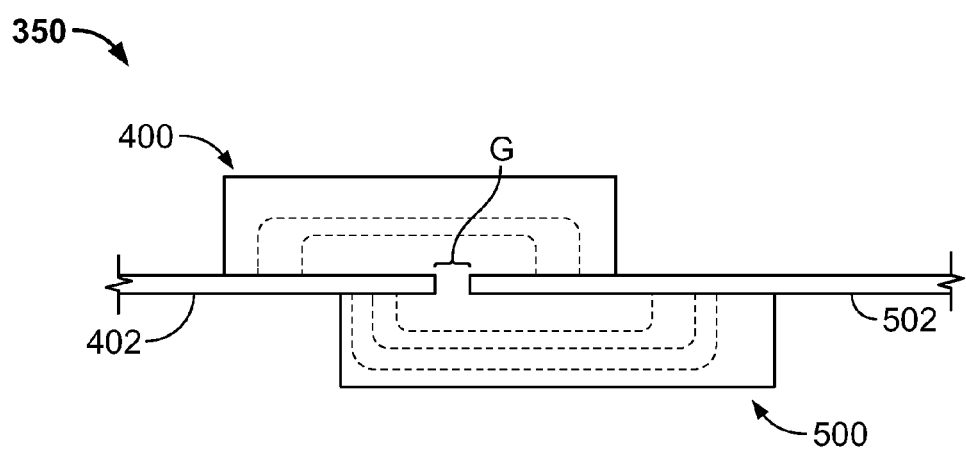
FIG. 7 is a side view of a bridge connector system formed in accordance with one embodiment.

FIG. 7 is a side view of a connector assembly 350 formed in accordance with one embodiment. The connector assembly 350 may include bridge connectors 400 and 500, which may have similar features as the connectors 100 (FIG. 1) and 300 (FIG. 6) described above. The connectors 400 and 500 may be used to mechanically and electrically couple circuit boards 402 and 502 together. As shown, the connectors 400 and 500 may mount and engage the circuit boards 402 and 502 from opposing board surfaces such that the circuit boards 402 and 502 are sandwiched therebetween. Furthermore, the circuit boards 402 and 502 may form a gap G therebetween. As shown, the connectors 400 and 500 may be staggered with respect to each other. In the staggered arrangement, the connector assembly 350 may allow a greater density of contacts for mechanically and electrically coupling the circuit boards 402 and 502 together. Furthermore, by forming interference fits with each circuit board 402 and 502 from each side of the circuit boards, the connector assembly 350 may provided a stronger interlocking mechanism than using just one connector.

Embodiments described herein include bridge connectors having a housing and bridge contacts that electrically and mechanically couple two or more circuit boards together. The bridge connectors may be constructed and mounted to circuit boards using less steps that at least some other known connectors. Furthermore, embodiments described herein include circuit board assemblies that utilize the bridge connectors in holding a plurality of circuit boards together.

It is to be understood that the above description is intended to be illustrative, and not restrictive. As such, the above-described embodiments (and/or aspects thereof) may be used in combination with each other. For example, the connectors 300, 315, 400, and 500 may have features similar to those described with respect to the connector 100. Furthermore, although the above description referred to coupling circuit boards in touch systems, embodiments described above may be used in a variety of electrical devices and systems that require mechanically and electrically coupling two or more circuit boards together.

In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments.

Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A bridge connector configured to electrically and mechanically couple first and second circuit boards, each circuit board including a board surface having through-holes, the connector comprising:

a housing having a coupling side configured to interface with the board surfaces when the housing is coupled to the first and second circuit boards;

a plurality of bridge contacts held within the housing, each said contact having tail portions projecting from the coupling side and each said tail portion configured for an interference fit with a corresponding said through-hole to couple the first and second circuit boards, wherein the tail portions are arranged to hold the first and second circuit boards along the coupling side;

wherein the housing includes a plurality of slots configured to receive the contacts, the plurality of slots including first and second slots extending along a common plane that is substantially perpendicular to the board surfaces, the first slot opening onto the coupling side and the second slot opening onto a side that is opposite the coupling side.

2. The connector in accordance with claim 1 wherein the tail portions are configured to hold the circuit boards such that edges of the circuit boards directly abut each other and form an edge interface.

3. The connector in accordance with claim 1 wherein the tail portions and the coupling side are configured to hold the first and second circuit boards such that the first and second circuit boards are coplanar with respect to each other.

4. The connector in accordance with claim 1 wherein the connector is formed from only the housing and the contacts.

5. The connector in accordance with claim 1 wherein each said slot is configured to receive a length of a corresponding contact.

6. The connector in accordance with claim 5 wherein the contacts are held in a stacked relationship when inserted into the housing.

7. The connector in accordance with claim 1 wherein each contact further comprises a body portion extending parallel to the board surfaces, the tail portions extending from the body portions along the common plane.

8. The connector in accordance with claim 1 wherein the housing is mounted onto the board surfaces.

9. The connector in accordance with claim 8 wherein the housing extends over only a portion of each board surface.

10. The connector in accordance with claim 1 wherein at least two of said contacts are held in a stacked relationship within the first and second slots along the common plane, and wherein said stacked contacts have a width and said housing has a housing thickness that extend along the common plane, the housing thickness being substantially equal to a sum of the widths of said stacked contacts and a thickness of housing material that separates the said stacked contacts.

11. The connector in accordance with claim 1 wherein the housing has a substantially rectangular body that includes a length and a width that extend along and form an interface with the board surfaces and a thickness that extends away from the board surface, wherein both the length and the width are greater than the thickness.

12. A bridge connector configured to electrically and mechanically couple first and second circuit boards, each said circuit board including a board surface having through-holes, the connector comprising:
- a housing having a coupling side configured to interface with the board surfaces when the housing is coupled to the first and second circuit boards; and
- at least one contact row including upper and lower bridge contacts held within the housing, each of the upper and lower bridge contacts configured to electrically couple the first and second circuit boards through a pair of tail portions that project from the coupling side, each said tail portion configured to form an interference fit with a corresponding said through-hole, wherein the interference fits of said upper and lower bridge contacts combine to form a rigid connection to the first and second circuit boards that mechanically holds the first and second circuit boards along the coupling sides
- wherein the housing includes a plurality of slots, each said slot configured to receive a length of a corresponding bridge contact and configured for interference fit with the corresponding bridge contact, said slots opening to one of the coupling side and a side that is opposite the coupling side, the length extending substantially parallel to the board surfaces and the tail portions extending substantially perpendicular to the board surfaces when the corresponding bridge contact is inserted into and held by said slot.

13. The connector in accordance with claim 12 wherein the tail portions extend along a common plane that is perpendicular to the board surfaces.

14. The connector in accordance with claim 12 wherein the connector is formed from only the housing and the bridge contacts.

15. The connector in accordance with claim 12 wherein the tail portions and the coupling side are configured to hold the first and second circuit boards such that the first and second circuit boards are coplanar with respect to each other.

16. The connector in accordance with claim 12 wherein the plurality of slots includes first and second slots extending along a common plane that is substantially perpendicular to the board surfaces, the first slot opening onto the coupling side and the second slot opening onto a side that is opposite the coupling side.

17. The connector in accordance with claim 12 wherein the at least one contact row includes a plurality of contact rows extending along a length of the housing, said contact rows being spaced apart from each other along a width of the housing.

18. The connector in accordance with claim 12 wherein the upper and lower bridge contacts of each contact row are stacked with respect to each other in the housing such that the upper and lower bridge contacts extend along a common plane that is perpendicular to the board surfaces.

* * * * *